United States Patent [19]

Müller et al.

[11] 3,880,682

[45] Apr. 29, 1975

[54] METHOD OF SIMULTANEOUS DOUBLE DIFFUSION

[75] Inventors: Wolfgang Müller, Vatterstetten; Joachim Dathe, Munich, both of Germany

[73] Assignee: Siemens Aktiengesellschaft, Berlin, Germany

[22] Filed: June 20, 1973

[21] Appl. No.: 371,771

Related U.S. Application Data

[62] Division of Ser. No. 114,760, Feb. 12, 1971, Pat. No. 3,764,412.

[30] Foreign Application Priority Data

Feb. 16, 1970 Germany ........................... 2006994

[52] U.S. Cl. ................ 148/175; 148/187; 148/188; 148/190

[51] Int. Cl. ............................ H01l 7/38; H01l 7/44

[58] Field of Search ........... 148/188, 187, 186, 189, 148/175, 190

[56] References Cited

UNITED STATES PATENTS

| | | | |
|---|---|---|---|
| 3,066,052 | 11/1962 | Howard | 148/188 X |
| 3,575,742 | 4/1971 | Gilbert | 148/187 |

*Primary Examiner*—G. Ozaki
*Attorney, Agent, or Firm*—Herbert L. Lerner

[57] ABSTRACT

The oxide layer is produced by thermal oxidation of the silicon surface using a processing gas comprising oxygen and an oxide of the dopant. This insures that during the production of the oxide layer no dopant penetrates into the semiconductor. Diffusion is carried out by a subsequently executed thermal process.

1 Claim, 6 Drawing Figures

METHOD OF SIMULTANEOUS DOUBLE DIFFUSION

Figure 1:
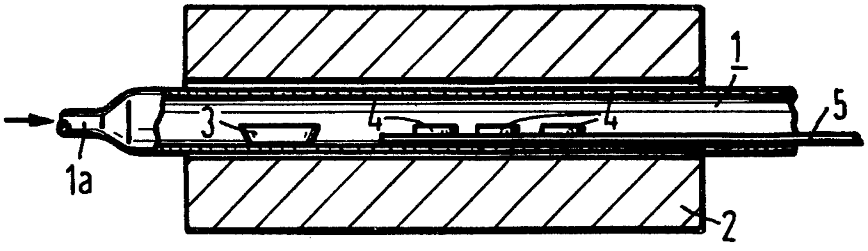

This is a division of application Ser. No. 114,760, filed Feb. 12, 1971, now U.S. Pat. No. 3,764,412.

Our invention relates to a method of doping a silicon crystal by indiffusing boron or phosphorus from a layer produced on the silicon surface and delivering the dopant. The layer develops under the influence of the dopant produced on the silicon surface, out of the gaseous phase, in form of an oxide.

This type of method is present, for example, in the known planar technique. Here $B_2O_3$ or $P_2O_5$ vapor acts in the presence of heat upon the parts of the silicon surface not covered by the mask to produce a thin, glassy layer which contains the respective dopant, which simultaneously indiffuses with the development of the dopant into the silicon. The doping glass is brought to the surface of the heated silicon body, in the aforedescribed method, mixed with an inert carrier gas.

Another embodiment lies in the pyrolytic precipitation of the doping oxide whereby a mixture of an inert carrier gas of a gaseous silicon compound, e.g. methyl siloxane delivering $SiO_2$ through pyrolysis and of the oxide of the dopant, e.g. $B_2O_3$ or $P_2O_5$, acts upon the heated silicon surface. Another possibility is in an anodic oxidation of the silicon surface in the presence of the respective dopant which is being installed into the anodically produced oxide layer on the silicon surface.

The last described method has the advantage that the coating process and the doping process are strictly separated from each other which, according to experience, leads to particularly well defined diffusion depths and surface concentrations of the semiconductor zones produced through diffusion. A disadvantage of the method is that it is very expensive as each semiconductor body requires a time consuming maintenance.

It is the object of the invention to provide a method where, on one hand as in the method of coating by means of anodic oxidation, the coating and the diffusion are strictly separated with respect to time, while on the other hand, a certain amount of semiconductor devices may be subjected to the method, simultaneously, without a special expensive maintenance.

This is accomplished according to the initially defined method of the invention by producing the doping, oxide layer through thermal oxidation of the silicon surface, by using as an oxidation agent, oxygen compounded with an oxide of the dopant.

This insures that the boundary between the silicon and the oxide mixture developing thereon is driven ahead faster into the semiconductor crystal, than is possible for the diffusion front of the dopant to penetrate into the semiconductor crystal. Experience has shown that following the completion of this process the dopant has not penetrated into the silicon. This fact is compensated after changing the processing gas and, if necessary, also the processing vessel by means of tempering, particularly at higher temperatures so that the coating process and the diffusion process are strictly separate from each other.

The method of the invention, among other things, permits the following possibilities for producing a semiconductor device: a silicon wafer is coated over its entire area based on the method of the invention, with a doping oxide layer. Subsequently, the oxidic layer is selectively etched away, at undesirable parts. The exposed silicon is free of dopant due to the coating method according to the invention. If the device is exposed in the presence of heat to a gaseous dopant that produces the opposite conductance type, then simultaneously a diffusion takes place of the coatings which stem from the preceding process and which are still present on the silicon surface. Consequently, acceptors and donors may be indiffused simultaneously into the silicon surface at various places, at the same time.

The invention will be further described with reference to specific examples with reference to the Drawing. These examples are merely to illustrate and not limit the invention.

In the Drawing:

FIG. 1 schematically illustrates a device for carrying out the invention; and FIGS. 2 – 6 illustrate steps used in the production of a device according to the invention.

FIG. 1 illustrates a device suitable for carrying out the method of the invention. The device comprises a quartz tube 1, which for the largest part, is located within a tubular furnace 2. A current of oxygen is introduced at the point of entrance 1a of the quartz tube, during the first phase of the method while argon or another inert gas is introduced during the second phase. The gas flows over a source 3 which delivers the oxide of the respective dopant to the oxygen and then arrives at the surface of the silicon crystals 4 which are to be coated. The crystals are situated on a slide 5.

After the coating process is completed, the source 3 is removed, if necessary, the oxygen current is replaced by the inert gas and the diffusion undertaken in the customary manner. The furnace is so constructed that a constant temperature prevails at least at the location of the silicon wafers 4.

The method of the invention may be performed in the following manner:

1. The doping oxide is formed on the silicon surface at 920°C in an $O_2$ current using a mixture of $B_2O_3$ and $SiO_2$ as a source; the action takes 120 minutes. The diffusion, subsequently occurs in an argon flow at 1,050°C for a period of 120 minutes.
2. Oxide is formed at 1,050°C in an oxygen current. The source comprises $B_2O_3$ and $SiO_2$; the action lasts 60 minutes. The actual diffusion takes place in an argon current at 1,200°C for a period of 60 minutes.

These embodiment examples may be varied in a manifold manner. It is only important that coating be effected in the presence of almost pure oxygen, while the diffusion may be carried out in a current of inert gas or in a mixture of inert gas and oxygen, or in a sequence of inert gas, then oxygen reducing the boron volume to be indiffused. As is easily seen from the above, the $B_2O_3$ may also be replaced by a phosphorus oxide particularly $P_2O_5$ if the aim is to produce a phosphorus doped, n-conducting zone.

The method of the invention is described in the following, with reference to another embodiment example, namely the production of a field effect transistor with self-adjusting source and drain regions.

Figure 2:
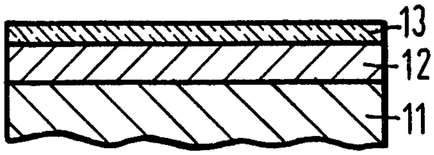

FIGS. 2 to 6 explain this sequence. A p-conducting, monocrystalline silicon wafer 11 is first provided with an n-conducting surface zone 12, which is precipitated by epitaxy and is in turn covered by a masking $SiO_2$ layer 13. This state is shown in FIG. 2.

Figure 3:
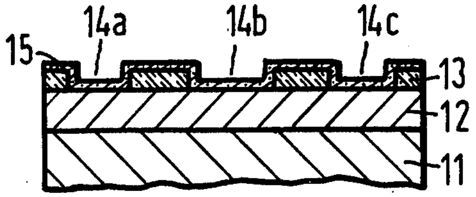
Figure 4:
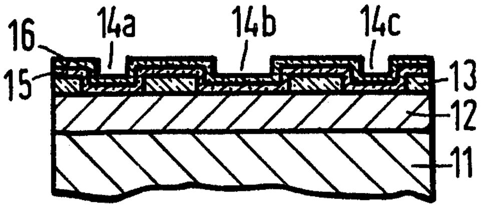
Figure 5:
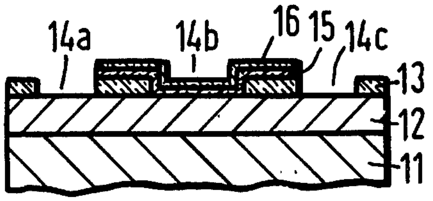

The $SiO_2$ layer is now removed by etching with a photoresist along parallel strips 14*a*, 14*b*, 14*c*, which individually correspond to the source, gate, drain zone, to be produced (see FIG. 3). According to the teaching of the invention doping oxide producing p-conductivity is precipitated over the entire surface, in form of a film 15 so that no boron penetrates into the lower lying silicon body. A masking $SiO_2$ film 16 is pyrolytically produced on film 15 through thermal dissociation of a suitable gaseous siloxane compound or a similar compound. The state obtained is shown in FIG. 4.

Both films are not removed from the silicon surface at the location of the two outer strips 14*a* and 14*c*, while they remain intact, at the median strip 14*b*. Thus, the condition shown in FIG. 5 results.

Figure 6:
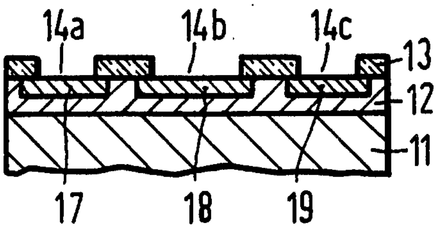

A donor containing gas is made to act upon this device, through simultaneous heating. The donor is so chosen that it does not penetrate into the $SiO_2$ coated silicon surface. Phosphorus is one example of a suitable donor substance, and is used as gaseous phosphorus hydride or phosphorus pentoxide. During the heating process, donor atoms at windows 14*a* and 14*c* and acceptor atoms at windows 14*b*, penetrate the interior of the epitactic layer 12 with the formation of an n+ conducting source zone 17, of a p+ conducting gate zone 18 and an n+ conducting drain zone 20. The resultant condition is illustrated in FIG. 6. In the final method steps, the obtained zones are provided with barrier-free contacts. For this end the oxide layers are previously removed at the surface of the gate zone by using a photoresist etching method.

The great advantage of this method lies in the fact that by establishing the geometry of the source drain and gate with a mask, the distances and the strip widths may be more closely controlled. Furthermore, this method helps to safeguard the symmetry of the transistor (interchangeability of source and drain).

Although argon is specifically used as the inert gas, other inert gases such as nitrogen or helium can be used.

We claim:

1. A process of doping a silicon crystal by indiffusion, which comprises producing epitaxially a layer of one conductance type on a wafer shaped silicon monocrystal of another conductance type, coating said epitaxial layer with a layer of $SiO_2$, etching at least two windows through the $SiO_2$ layer which open onto the epitaxial layer, producing an $SiO_2$ doping layer, containing boron or phosphorus as dopant, using pure oxygen as oxidation means with neither the boron nor phosphorus indiffusing into the underlying silicon, covering the dopant containing layer in at least one window with a pyrolytically produced $SiO_2$ layer, opening at least one window to the underlying semiconductor surface, while the dopant containing $SiO_2$ layer remains at least in another window, and bringing a dopant substance of opposite type from the gas phase through the opened window, and heating the doped device so that indiffusion also takes place from the dopant containing $SiO_2$ layer covered windows into the underlying epitaxial layer.

* * * * *